(12) United States Patent
Kim et al.

(10) Patent No.: US 6,391,499 B1
(45) Date of Patent: May 21, 2002

(54) LIGHT EXPOSURE MASK AND METHOD OF MANUFACTURING THE SAME

(75) Inventors: Yong-Wan Kim; Jong-Woo Kim, both of Kyongbuk (KR)

(73) Assignee: LG Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/599,388

(22) Filed: Jun. 22, 2000

(51) Int. Cl.[7] ............................................. G03F 9/00
(52) U.S. Cl. ............................................................. 430/5
(58) Field of Search .................. 430/5, 322; 378/35; 250/492.2

(56) References Cited

U.S. PATENT DOCUMENTS

| | | | |
|---|---|---|---|
| 4,415,262 A | * 11/1983 | Koyama et al. | 430/5 |
| 5,614,335 A | * 3/1997 | Hashimoto et al. | 430/5 |
| 5,936,707 A | * 8/1999 | Nguyen et al. | 430/5 |

FOREIGN PATENT DOCUMENTS

JP    H2-299125    12/1990

OTHER PUBLICATIONS

Abstract: Japan patent publication No. H2–299125; dated Dec. 11, 1990; Title: "Electrode Forming Method and Electron Wire Display Device".

* cited by examiner

*Primary Examiner*—S. Rosasco
(74) *Attorney, Agent, or Firm*—Birch, Stewart, Kolasch & Birch, LLP

(57) ABSTRACT

The present invention discloses a light exposure mask which comprises a substrate including: a light transmitting region for transmitting incident light perfectly; a light shielding region for shielding the incident light perfectly; and a light semi-transmitting region for transmitting part of the incident light. And the method for manufacturing the mask is also disclosed using depositing and patterning processes. The inventive mask can improve a step coverage and reduce a process time for forming a dual-layered layer.

8 Claims, 6 Drawing Sheets

LIGHT EXPOSURE MASK AND METHOD OF MANUFACTURING THE SAME

BACKGROUND OF THE INVENTION

1. Field of the Invention

The present invention relates to a light exposure mask and a method of manufacturing the same, and more particularly, to a light exposure mask and a method of manufacturing the same for use in a liquid crystal display (LCD) device.

2. Description of Related Art

FIG. 1 is a plan view illustrating a typical LCD device. As shown in FIG. 1, the typical LCD device comprises gate lines 60 arranged in a transverse direction, data lines 70 arranged in a longitudinal direction perpendicular to the gate lines 60, thin film transistors (TFTs) "S" located near cross points of the gate lines 60 and the data lines 70, and pixel regions 40 defined by the gate lines 60 and the data lines 70.

The typical LCD device is manufactured by the following processes. FIG. 2 is a cross-sectional view taken along line ||—|| of FIG. 1. First, a gate electrode 60a is formed on a transparent substrate 10, and then a gate insulating layer 50 made of a inorganic material such as SiNx or SiOx is formed on the whole surface of the transparent substrate 10 while covering the gate electrode 60a. The gate electrode 60a contacts the gate line 60. Sequentially, a semiconductor layer 80 is formed over the gate electrode 60a in the form of an island. The semiconductor layer 80 has an amorphous silicon layer 80a and a doped amorphous silicon layer 80b. Source and drain electrodes 70a and 70b spaced apart from each other are formed overlapping a region of both ends of the doped amorphous silicon layer 80b. The source electrode 70a contacts the data line 70, and the drain electrode 70b contacts a pixel electrode that is formed in a subsequent process. Then, a passivation layer 55 is formed on the whole surface of the transparent substrate 10 covering the source and drain electrodes 70a and 70b, and then a contact hole 42 is formed at a predetermined location over the drain electrode 70b. The pixel electrode 44 is formed on the pixel region 40 to contact the drain electrode 70b through the contact hole 42.

Most components of the typical LCD device described above are formed using several photolithography processes. In the conventional photolithography process, as shown in FIG. 3A, a metal layer 90 is formed on the substrate 10. Either a positive or a negative photoresist is applied on the metal layer 90, and then a light exposure mask 88 is aligned. FIG. 3A shows the positive photoresist 100, and the light exposure mask 88 has light transmitting regions 88a, 88c and a light shielding region 88b. Sequentially, when UV light is irradiated toward the light exposure mask 88, the photoresist 100 is developed, thereby forming a photoresist pattern 10a shown in FIG. 3B.

Then, the photoresist pattern 10a is subjected to a predetermined temperature and atmosphere to become hardened. The metal layer 90 is etched according to the photoresist pattern 100a using either of a dry etching technique or a wet etching technique so that a metal pattern layer 90a is formed as shown in FIG. 3C. Finally, the photoresist patter 100a remaining on the metal pattern layer 90a is removed.

However, when using the conventional light exposure mask 88 described above, since the light transmitting regions 88a, 88c and the light shielding region 88b of the light exposure mask 88 transmits and shields the UV light perfectly, respectively, the metal pattern layer 90a formed comes to have an almost rectangular-shaped cross section. Therefore, when another metal layer (not shown) is formed on the rectangular-shaped metal pattern layer 90a, there arises a problem in that step coverage becomes degraded so that an open line may occur at a step portion.

FIGS. 4A through 4C show another photolithography process to form a dual-layered metal pattern layer. As shown in FIG. 4A, first and second metal layers 90 and 91 are sequentially formed on a transparent substrate 10, and a positive photoresist 100 is applied on the second metal layer 91. Then, a light exposure mask 88 having a light transmitting region 80a and a light shielding region 80b is aligned. Sequentially, when UV light is irradiated toward the light exposure mask 88, the photoresist 100 is developed, thereby forming a photoresist pattern 100a as shown in FIG. 4B.

Then, the photoresist pattern 100a is subjected to a predetermined temperature and atmosphere to become hardened. The first and second metal layers 90 and 91 are simultaneously etched according to the photoresist pattern 100a using either of a dry etching technique or a wet etching technique so that first and second metal pattern layers 90a and 91a are formed, as shown in FIG. 4C. Finally, the photoresist pattern 100a remaining on the second metal pattern layer 91a is removed.

However, when using the conventional light exposure mask 88 described above, the metal pattern layers 90 and 91 inevitably have the same shape, thus, in order to form different shaped metal layers, an additional photolithography process should be performed again, leading to a lengthy processing time and a low yield.

SUMMARY OF THE INVENTION

To overcome the problems described above, preferred embodiments of the present invention provide a light exposure mask having a substrate defined by the following three regions: a light transmitting region, a light shielding region and a light semi-transmitting region.

Another embodiment of the invention provides a method for manufacturing a light exposure mask having a light transmitting region, a light shielding region, and a semi-transmitting region, comprising the steps of: preparing a transparent substrate; forming a semi-transmitting layer and a light shielding layer on the substrate in this order; patterning the light shielding layer to define the light shielding region of the substrate; and patterning the semi-transmitting layer so that the semi-transmitting region of the substrate is covered by the patterned semi-transmitting layer.

The light shielding layer preferably has Cr/CrOx, and the semi-transmitting layer preferably has indium tin oxide.

Another embodiment of the invention provides a method for manufacturing a light exposure mask having a light transmitting region, a light shielding region, and a semi-transmitting region, comprising the steps of: preparing a transparent substrate; forming a light shielding layer on the substrate; patterning the light shielding layer to define the light shielding region of the substrate; forming a semi-transmitting layer on the substrate while covering the patterned light shielding layer; and patterning the semi-transmitting layer so that the semi-transmitting region of the substrate is covered by the patterned semi-transmitting layer.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Reference will now be made in detail to the preferred embodiment of the present invention, examples of which are illustrated in the accompanying drawings.

A light exposure mask according to a preferred embodiment of the present invention has a transparent substrate defined by the following three regions: a light transmitting region, a light shielding region and a light semi-transmitting region. The semi-transmitting region of the substrate can be defined by a material for transmitting a range between 60 and 80% of the incident light, for example indium tin oxide (ITO), and the light shielding region of the substrate is defined by a material for shielding the incident light perfectly, preferably Cr/CrOx.

Figure 1:
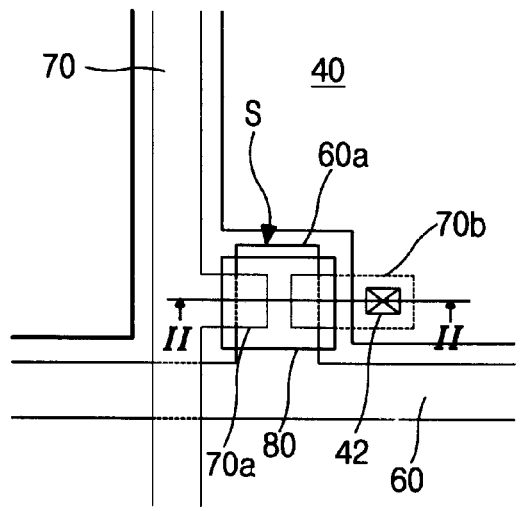
FIG. 1 is a plan view illustrating a typical liquid crystal display device.
Figure 2:
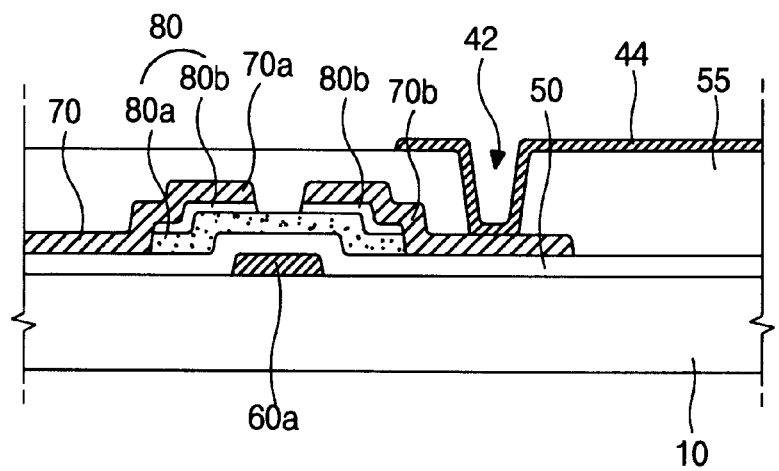
FIG. 2 is a cross-sectional view taken along line ∥—∥of FIG. 1.
Figure 3A:
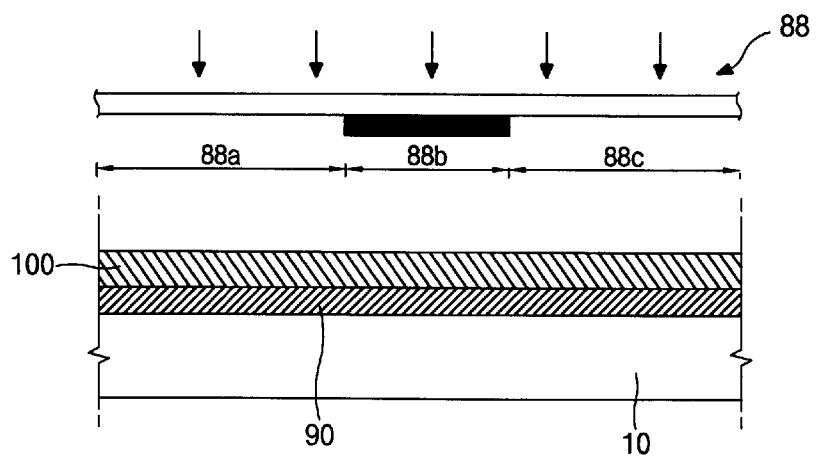
FIGS. 3A to 3C are cross-sectional views illustrating a conventional photolithography process.
Figure 3B:
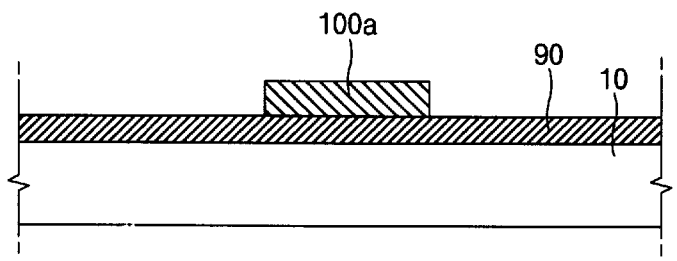
Figure 3C:
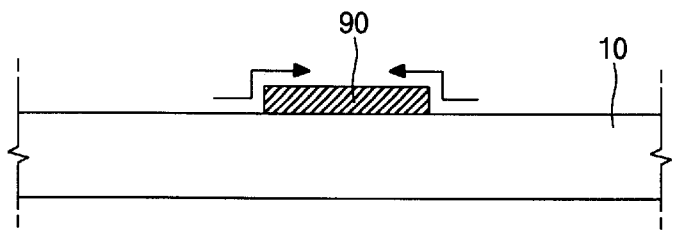
Figure 4A:
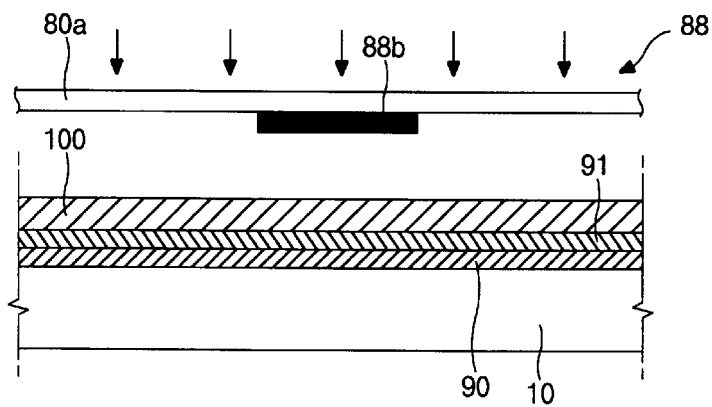
FIGS. 4A to 4C are cross-sectional views illustrating another conventional photolithography process.
Figure 4B:
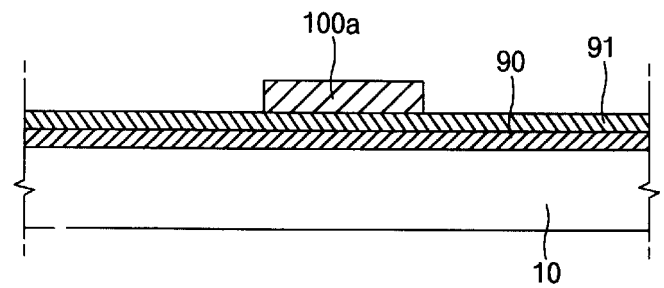
Figure 4C:
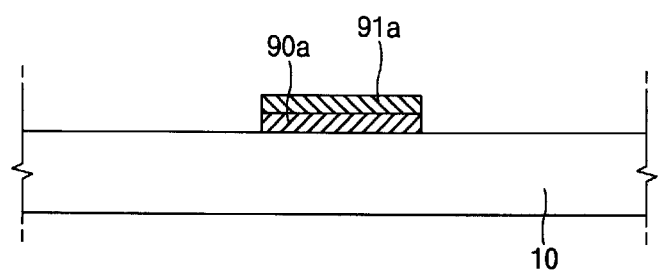
Figure 5A:
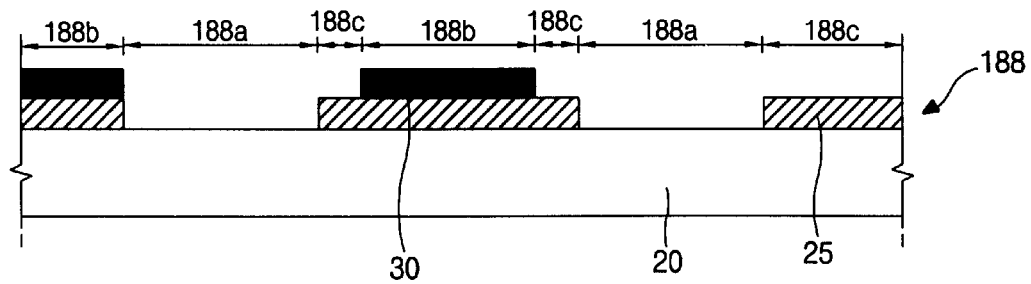
FIG. 5A is a cross-sectional view illustrating a light exposure mask according to a first preferred embodiment of the present invention.
Figure 5B:
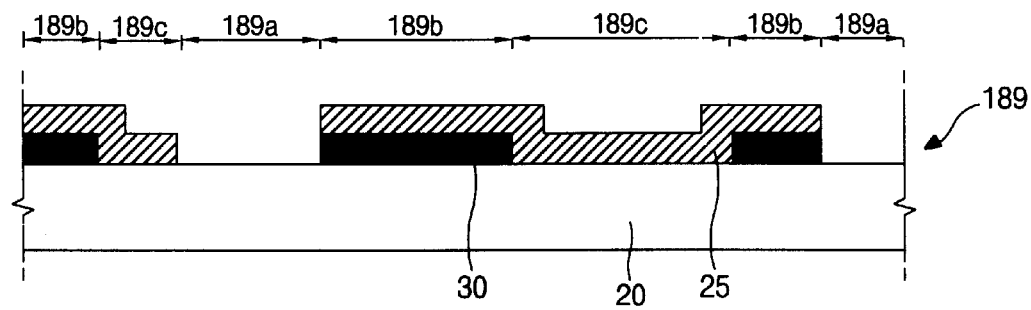
FIG. 5B is a similar view of FIG. 5A illustrating a light exposure mask according to a second preferred embodiment of the present invention.
Figure 5C:
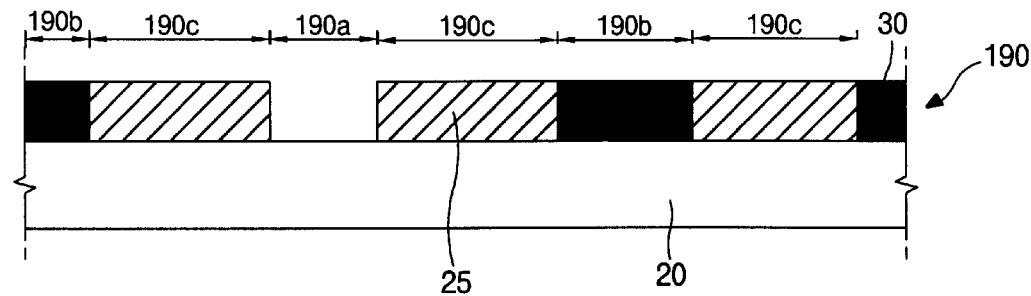
FIG. 5C is a similar view of FIG. 5A illustrating a light exposure mask according to a third preferred embodiment of the present invention.

FIGS. 5A to 5C show different methods of manufacturing the inventive light exposure mask. The inventive light exposure mask is manufactured as follows. First, as shown in FIG. 5A, the ITO layer and the Cr/CrOx layer are sequentially deposited on a substrate 20 and patterned to form ITO patterns 25 and Cr/CrOx patterns 30, respectively, thereby forming the dual-layered light exposure mask 188. At this point, reference numerals 188a, 188b and 188c denote the light transmitting region, the light shielding region, and the light semi-transmitting region, respectively. Further, as shown in FIG. 5B, the Cr/CrOx layer is first deposited on the transparent substrate 20 and patterned to form Cr/CrOx patterns 30. Then, the ITO layer is deposited on the exposed surface of the substrate while covering the Cr/CrOx patterns 30 and patterned to form the ITO patterns 25, thereby forming the light exposure mask 189. At this point, reference numerals 189a, 189b and 189c denote the light transmitting region, the light shielding region and the light semi-transmitting region, respectively. Furthermore, as shown in FIG. 5C, the light exposure mask 190 may have a shape that the ITO patterns 25 are located between the Cr/CrOx patterns 30 by depositing and etching processes.

Using the light exposure mask 188 shown in FIG. 5A, a photolithography process according to the preferred embodiment of the present invention is explained in detail hereinafter.

Figure 6A:
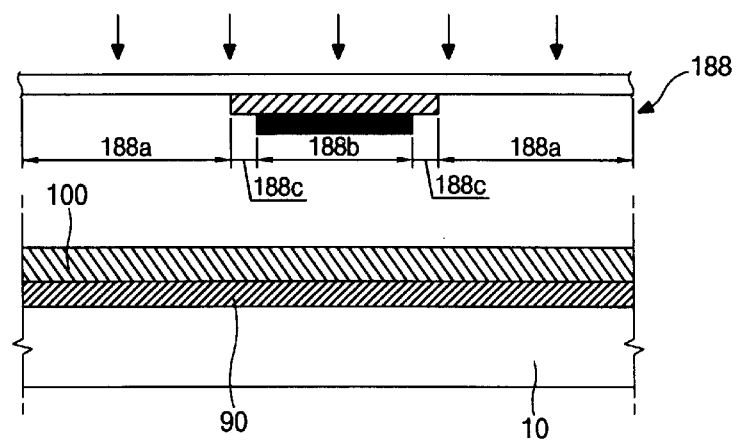
FIGS. 6A to 6C are cross-sectional views illustrating a photolithography process using a mask of FIG. 5A.
Figure 6B:
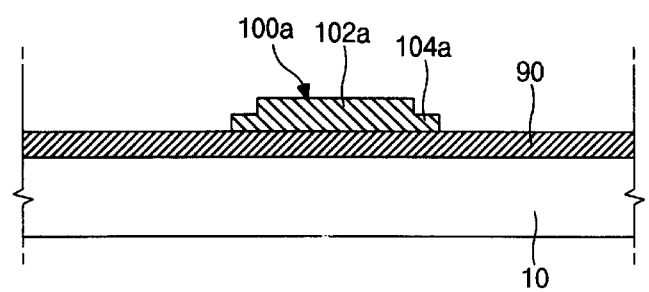

As shown in FIG. 6A, a metal layer 90 is deposited on a transparent substrate 10, and then a photoresist of a predetermined thickness is applied on the metal layer 90. Then, the light exposure mask 188 having the light transmitting region 188a, a light shielding region 188b and a light semi-transmitting region 188c is aligned. Sequentially, when UV light is irradiated toward the light exposure mask 188, the photoresist 100 is developed, thereby forming a photoresist pattern 100a as shown in FIG. 6B. The photoresist pattern 100a has a portion 102a corresponding to the light shielding region 188b and a portion 104a corresponding to the light semi-transmitting region 188c. The portion 104a is thinner in thickness than the portion 102a since the light semi-transmitting region transmits a range between 60 and 80% of the incident light.

Figure 6C:
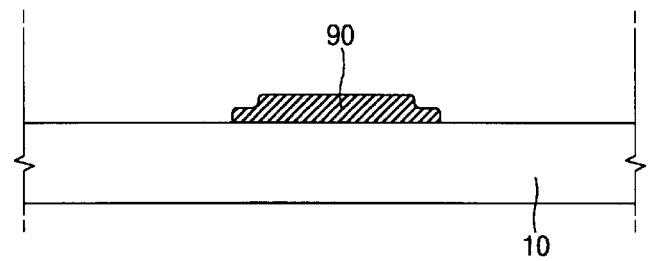

Then, the photoresist pattern 100a is subjected to a predetermined temperature and atmosphere to become hardened. The metal layer 90 is etched according to the photoresist pattern 100a using an etching technique such as a dry etching technique so that a metal pattern layer 90a is formed as shown in FIG. 6C. Finally, the photoresist pattern 100a remaining on the metal pattern layer 90a is removed.

Since the metal pattern layer 90a formed has a step shape, that is, a thickness of the metal pattern layer 90a can be adjusted according to a location of the light shielding region 188c, step coverage can be improved so that a line open of a step portion is prevented.

Figure 7A:
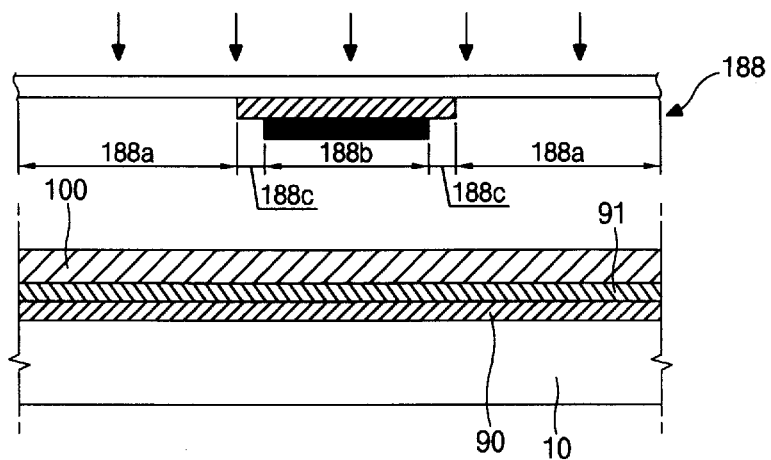
FIGS. 7A to 7C are cross-sectional views illustrating another photolithography process using a mask of FIG. 5A.
Figure 7B:
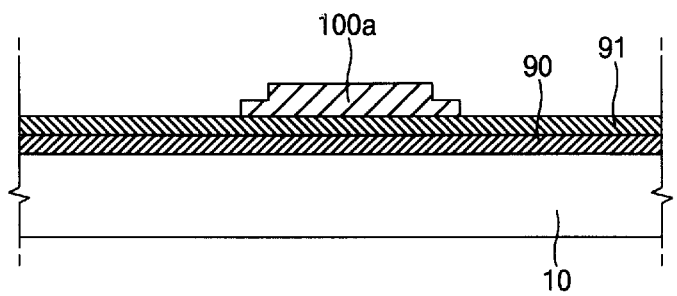
Figure 7C:
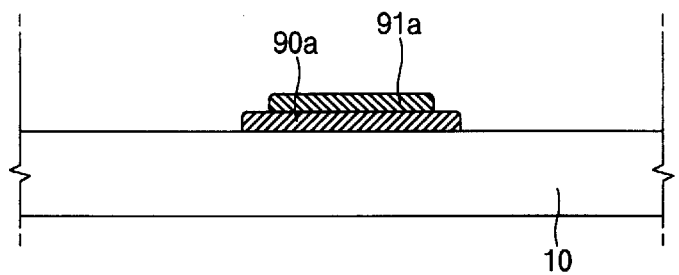

FIGS. 7A to 7C show another photolithography process to form a dual-layered metal pattern layer. As shown in FIG. 7A, first and second metal layers 90 and 91 are sequentially formed on a transparent substrate 10, and a positive photoresist 100 is applied on the second metal layer 91. Then, a light exposure mask 88 having a light transmitting region 188a, a light shielding region 188b and the light semi-transmitting region 188c is aligned. Sequentially, when UV light is irradiated toward the light exposure mask 188, the photoresist 100 is developed, thereby forming a photoresist pattern 100a as shown in FIG. 7B.

Then, the photoresist pattern 100a is subjected to a predetermined temperature and atmosphere to become hardened. The first and second metal layers 90 and 91 are simultaneously etched according to the photoresist pattern 100a using an etching technique such as a dry etching so that first and second metal pattern layers 90a and 91a are formed as shown in FIG. 7C. Finally, the photoresist pattern 100a remaining on the second metal pattern layer 91a is removed.

In this description, each first and second metal pattern layers 90a and 91a having a different shape from each other can be formed using only one photolithography process since the photoresist pattern 100a can have different thicknesses according to location.

As described herein before, using the light exposure mask having three regions (the light transmitting region, the light shielding region, and the light semi-transmitting region) can adjust the thickness of a formed metal pattern layer according to each location of the light transmitting region, the light shielding region and the light semi-transmitting region, so that step coverage is improved, thereby preventing a line defect. Further, since upper and lower metal pattern layers of a dual-layers of a dual-layered structure can have different shapes from each other according to each location of the light transmitting region, the light shielding region and the light semi-transmitting region using only one photolithography process, the processing time can be reduced, thereby causing high yields.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A light exposure mask, comprising, a substrate including:
   a light transmitting region for transmitting incident light perfectly;
   a light shielding region for shielding the incident light perfectly; and
   a multi-layer light semi-transmitting region for transmitting part of the incident light, wherein the multi-layer is one of ITO formed over CrOx, CrOx formed over ITO or ITO formed over CrOx formed over ITO.

2. The light exposure mask of claim 1, further comprising a material for transmitting a range between 60 and 80% of the incident light which comprises the light semi-transmitting region of the substrate.

3. The light exposure mask of claim 1, wherein a Cr/CrOx layer comprises the light shielding region of the substrate.

4. A method for manufacturing a light exposure mask having a light transmitting region, a light shielding region, and a semi-transmitting region, comprising the steps of:
   preparing a transparent substrate;
   depositing a semi-transmitting layer and a light shielding layer on the substrate in this order;
   patterning the light shielding layer to define the light shielding region of the substrate; and
   patterning the semi-transmitting layer so that the semi-transmitting region of the substrate is covered by the patterned semi-transmitting layer, wherein the semi-transmitting layer is a multi-layer semi-transmitting layer, and the multi-layer is one of ITO formed over CrOx, CrOx formed over ITO or ITO formed over CrOx formed over ITO.

5. The method of claim 4, wherein the light shielding layer comprises Cr/CrOx.

6. A method for manufacturing a light exposure mask having a light transmitting region, a light shielding region, and a semi-transmitting region, comprising the steps of:
   preparing a transparent substrate;
   depositing a light shielding layer on the substrate;
   patterning the light shielding layer to define the light shielding region of the substrate; and
   forming a semi-transmitting layer on the substrate while covering the patterned light shielding layer; and
   patterning the semi-transmitting layer so that the semi-transmitting region of the substrate is covered by the patterned semi-transmitting layer, wherein the semi-transmitting layer is a multi-layer semi-transmitting layer, and the multi-layer is one of ITO formed over CrOx, CrOx formed over ITO or ITO formed over CrOx formed over ITO.

7. The method of claim 6, wherein the light shielding layer comprises Cr/CrOx.

8. A light exposure mask, comprising:
   a light transmitting region for transmitting incident light perfectly;
   a light shielding region for shielding the incident light perfectly; and
   a multi-layer light semi-transmitting region for transmitting part of the incident light, wherein the multi-layer is one of ITO formed over CrOx, CrOx formed over ITO or ITO formed over CrOx formed over ITO.

* * * * *